United States Patent [19]
Shoji et al.

[11] Patent Number: 5,742,199
[45] Date of Patent: Apr. 21, 1998

[54] FILTER CIRCUIT AND ELECTRONIC APPARATUS

[75] Inventors: Norio Shoji; Katsuyuki Yonezawa, both of Kanagawa, Japan

[73] Assignee: Sony Corporation, Japan

[21] Appl. No.: 665,446

[22] Filed: Jun. 18, 1996

[30] Foreign Application Priority Data

Jun. 21, 1995 [JP] Japan .................................. 7-179504

[51] Int. Cl.$^6$ .................................................. H03K 5/00
[52] U.S. Cl. .......................... 327/552; 327/563; 330/306; 365/65
[58] Field of Search .................................. 327/552, 553, 327/555, 556, 557, 558, 559, 560, 563, 311; 330/294, 107, 109, 306; 360/65

[56] References Cited

U.S. PATENT DOCUMENTS 4,914,401  4/1990  Mader .................................. 330/306
5,327,302  7/1994  Khoury et al. .......................... 360/65

*Primary Examiner*—Timothy P. Callahan
*Assistant Examiner*—Dinh Tole
*Attorney, Agent, or Firm*—Ronald P. Kananen

[57] ABSTRACT

A filter circuit and an electronic apparatus using the filter circuit in which the manufacturing process can be simplified and the circuit is reduced in its size, and the minimum operating voltage is increasingly lowered and dynamic range is expanded comparing to that of prior art. A capacitor C taking out a signal component in a predetermined band from both ends is connected in series to a first diode, which is constantly in a conducting state by a second current source for diode, of a first differential pair to which the input signal of one differential input signal is supplied, and a second diode, which is constantly in a conducting state by a fourth current source for diode, of a second differential pair to which the other input signal is supplied.

6 Claims, 8 Drawing Sheets

5,742,199

FILTER CIRCUIT AND ELECTRONIC APPARATUS

BACKGROUND OF THE INVENTION

1. Field of the Invention

This invention relates to a filter circuit, more particularly, is applicable to a filter circuit in which low voltage operation and dynamic range are required.

2. Description of the Related Art

FIG. 1 shows a circuit example of a primary low-pass filter, and FIG. 2 shows the constitution of a differential integrator used in this primary filter. The differential integrator 1 is constituted by a differential input stage and a differential output stage. The differential input stage is composed of a differential pair of transistors Q1 and Q2, two resistors R1 for expanding dynamic range, and a constant current source 2 for supplying a constant current $I_1$ to the differential pair, which converts an input voltage $V_{IN}$ into a differential current.

The differential output stage is composed of a reference voltage source Vref, diodes D1 and D2, a differential pair of NPN transistors Q3 and Q4, load PNP transistors P1 and P2, and a constant current source 3 for supplying a constant current $I_2$ to the differential pair, which constitute a Gilbert multiplier. The differential output stage amplifies the differential current obtained from the differential input state and generates a differential output current ±io. The differential output current ±io is charged and discharged in respective one ends of two capacitors C.

Thus, an output voltage $V_O$ is taken out from the difference between respective one ends of the two capacitors C.

At this time, the voltage-to-current conversion coefficient gm of the differential integrator 1 is given by the following equation:

$$gm = \frac{io}{V_{IN}} = \frac{re1}{re1+R} \times \frac{1}{2\,re2} \tag{1}$$

where, $$re1 = \frac{2\,V_T}{I_1}, \quad re2 = \frac{2\,V_T}{I_2}$$

The output voltage $V_O$ can be expressed, with a complex angle frequency being as "s", by the following equation:

$$V_O = \frac{re1}{re1+R} \times \frac{1}{2\,re2} \times \frac{2}{sC} \tag{2}$$

$$= \frac{re1}{(re1+R)re2 \cdot C} \times \frac{1}{s}$$

As a result, the transfer function H ($=V_O/V_{IN}$) of the primary low-pass filter shown in FIG. 1 is given by the following equation:

$$H = \frac{V_O}{V_{IN}} = \frac{\frac{2gm}{C}}{s + \frac{2gm}{C}} \tag{3}$$

The conventional primary filter needs a common-mode feedback circuit 4 for stabilizing the collector voltages of the transistors Q3 and Q4. Furthermore, there is the problem that the number of devices of the entire primary filter and the chip area are increased. Likewise, a secondary filter can not avoid the same problem because the several primary filters having an integrator (1/s) are needed.

Recently, it is desired to use an electronic apparatus with the low voltage source of a small battery. Therefore, the filters used in the electronic apparatus is also desired to be used with the low voltage source.

However, the primary filter described above has the common-mode feedback circuit 4, and the transistors P1, P2 and the transistors Q3, Q4 are connected to a power source in series. Thereby, there is a problem that it is difficult to use the filter with the low source voltage sufficiently.

SUMMARY OF THE INVENTION

In view of the foregoing, an object of this invention is to provide a filter circuit, which is capable of realizing a reduction in the scale of the circuit, lowering the minimum operation voltage and expanding dynamic range. Another object of this invention is to provide an electronic apparatus using the filter circuit.

The foregoing objects and other objects of the invention have been achieved by the provision of a filter circuit comprising: a first differential pair composed of a first transistor to which one input signal of a differential input signal is supplied at the input terminal, and a first diode, connected in series to the emitter of the first transistor, differentially operating with the first transistor; a first current source, provided between the emitter of the first transistor and a first power-supply source, for driving at least the first transistor; a second current source, provided between the first diode and a second power-supply source, for constantly conducting the first diode; a second differential pair composed of a second transistor to which the other input signal of the differential input signal is supplied at the input terminal, and a second diode, connected in series to the emitter of the second transistor, differentially operating with the second transistor; a third current source, provided between the emitter of the second transistor and a first power-supply source, for driving at least the second transistor; a fourth current source, provided between the second diode and a second power-supply source, for constantly conducting the second diode; and a capacitor, connected in series to the first and second diodes between the emitters of the first and second transistors, for taking out a signal component in a predetermined band from both ends.

A capacitor C taking out a signal component in a predetermined band from both ends is connected in series to a first diode which is constantly in a conducting state by a second current source for diode among a first differential pair to which one input signal of the differential input signal is supplied, and a second diode which is constantly in a conducting state by a fourth current source for diode among a second differential pair to which the other input signal is supplied. Therefore, a filter circuit and an electronic apparatus using the filter circuit can be realized, in which the manufacturing process can be simplified, the scale of a circuit can be reduced, and the minimum operating voltage is increasingly lowered and dynamic range is expanded comparing to that of the prior arts.

Further, according to this invention, in an electronic apparatus having a processing circuit for processing a signal based on the signal component in a predetermined band extracted in the filter circuit which gives a differential input signal, the filter circuit, comprising: a first differential pair composed of a first transistor to which one input signal of a differential input signal is supplied at the input terminal, and a first diode, connected in series to the emitter of the first transistor, differentially operating with the first transistor; a first current source, provided between the emitter of the first transistor and a first power-supply source, for driving at least the first transistor; a second current source, provided between the first diode and a second power-supply source, for constantly conducting the first diode; a second differential pair composed of a second transistor to which the other input signal of the differential input signal is supplied at the input terminal, and a second diode, connected in series to the emitter of the second transistor, differentially operating with the second transistor; a third current source, provided between the emitter of the second transistor and a first power-supply source, for driving at least the second transistor; a fourth current source, provided between the second diode and a second power-supply source, for constantly conducting the second diode; and a capacitor, connected in series to the first and second diodes between the emitters of the first and second transistors, for taking out the signal component in a predetermined band from both ends.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings:

(1) Secondary filter (1-1) Basic constitution (primary filter)

Figure 1:
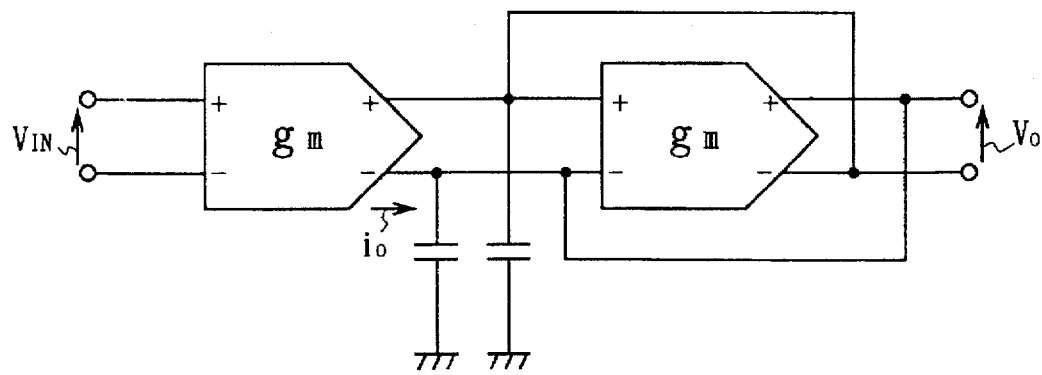
FIG. 1 is a block diagram showing a circuit example of a conventional primary low-pass filter.
Figure 2:
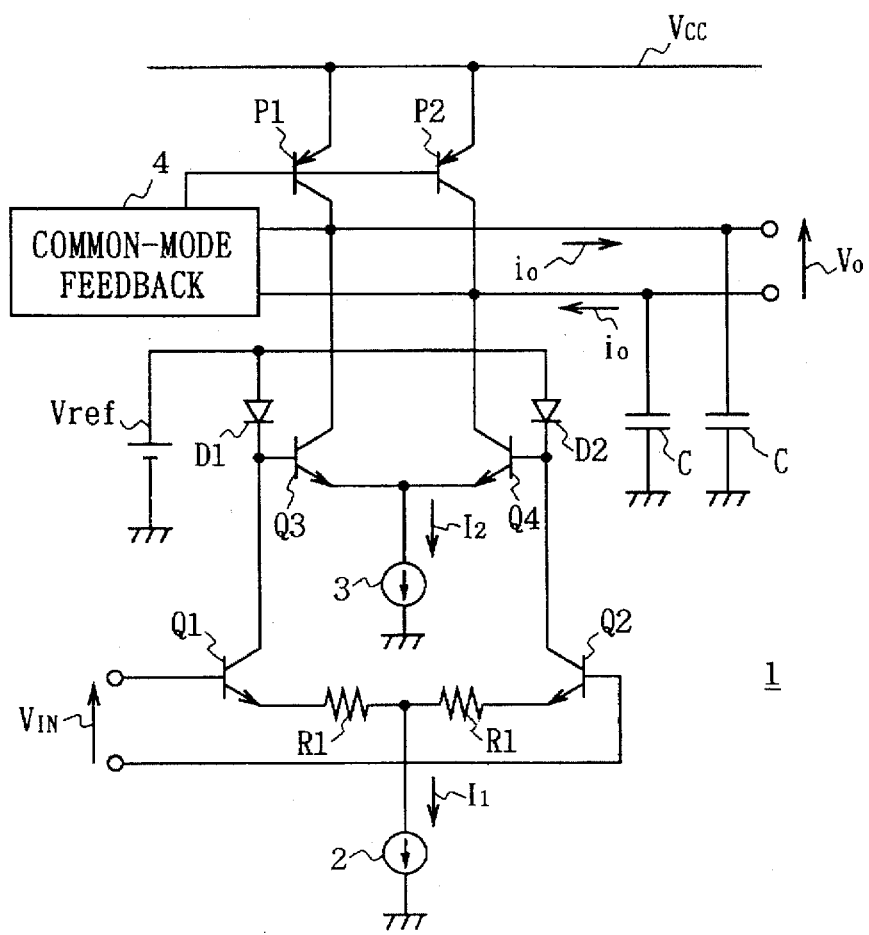
FIG. 2 is a circuit diagram showing the constitution of a differential integrator.
Figure 3:
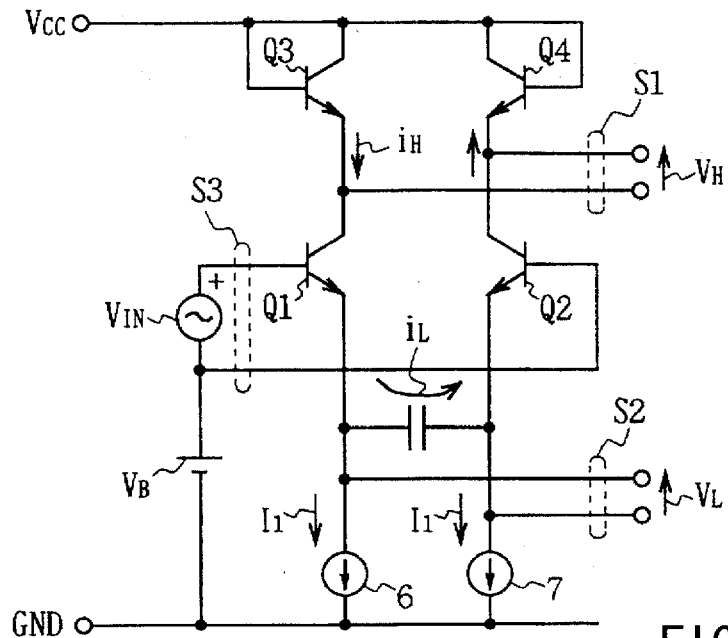
FIG. 3 is a circuit diagram showing the basic constitution of a filter circuit according to the present invention.

In FIG. 3 in which the portions corresponding to those of FIG. 1 are designated with the same symbols, 5 shows a primary filter as a whole and is used in a secondary filter according to the present invention. The primary filter 5 is constituted by a differential pair, a diode, a current source, and a capacitor. The primary filter 5 outputs a differential signal S1 with a high frequency pass characteristic from the midpoint of the connection between the differential pair and the diode. Also, the primary filter 5 outputs a differential signal S2 with a low frequency pass characteristic from the midpoint of the connection between the differential pair and the current source.

The concrete constitution of each part will subsequently be described. The differential pair comprises a pair of transistors Q1 and Q2. A differential signal S3 is input to the bases of the transistors Q1 and Q2. The diode comprises, e.g., diode-connected transistors Q3 and Q4 where the base and the collector short, and the emitters of the transistors Q3 and Q4 are connected to the collectors of the transistors Q1 and Q2 constituting the differential pair. Each collector of transistors Q3 and Q4 is connected to a power-supply voltage $V_{CC}$.

The current source is constituted by constant current sources 6 and 7. The constant current sources 6 and 7 are provided between a ground line GND and the emitters of the transistors Q1 and Q2 constituting the differential pair so that constant currents $I_1$ is supplied to each of transistors Q1 and Q2. The capacitor C is connected between the emitters of the transistors Q1 and Q2 constituting the differential pair.

It will be described in the aforementioned constitution that an output with each frequency characteristic is obtained from each output terminal of the primary filter 5. First, it will be described that a low-pass filter characteristic is obtained. When the differential signal S3 of the differential voltage $V_{IN}$ is now input, current $i_L$ flows to the capacitor C. When the emitter resistance of the transistors Q1 and Q2 constituting the differential pair is taken to be "re $(=V_T/I)$", the current $i_L$ is obtained as the following equation:

$$i_L = \frac{V_{IN}}{2\,re + \frac{1}{sC}} \tag{4}$$

Therefore, the differential voltage $V_L$ generated between the emitters of the transistors Q1 and Q2 is obtained by the following equation:

$$V_L = \frac{1}{sC} i_L = \frac{\frac{1}{sC}}{2\,re + \frac{1}{sC}} V_{IN} = \frac{\frac{1}{2\,re\,C}}{s + \frac{1}{2\,re\,C}} \cdot V_{IN} \tag{5}$$

At this point, if ½ re C=*c, a ratio of the differential voltage $V_{IN}$ and the differential voltage $v_L$ is expressed by the following equation:

$$\frac{V_L}{V_{IN}} = \frac{\omega C}{s + \omega c} \tag{6}$$

From the foregoing it is found that the differential signal S2 with a primary low-pass filter characteristic, where a cut-off frequency fc is taken to be ωc/2π, is obtained from the midpoint of the connection between the differential pair and the current source.

Subsequently it will be described that a high-pass filter characteristic is obtained. If a current amplification factor β is now assumed to be infinity, then current $i_H$, which flows to the transistors Q3 and Q4 when the differential signal S3 of the differential voltage $V_{IN}$ is input, equals to the current $i_L$. At this time, the differential voltage $V_H$ of the differential signal S1 generated at the collectors of the transistors Q1 and Q2 is obtained as the following equation:

$$\begin{aligned}V_H &= V_{Q4E} - V_{Q3E} \\&= (V_{CC} + i_H re) - (V_{CC} - i_H re) \\&= 2\,re\,i_H \\&= 2\,re\,i_L \\\\&= \frac{2\,re}{2\,re + \frac{1}{sC}} V_{IN} \\\\&= \frac{s}{s + \frac{1}{2\,re\,C}} V_{IN} = \frac{s}{s + \omega c} V_{IN}\end{aligned} \tag{7}$$

Therefore, if a ratio of the differential voltage $V_{IN}$ and the differential voltage $V_H$ is calculated, then the following equation is obtained:

$$\frac{V_H}{V_{IN}} = \frac{s}{s + \omega L} \quad (8)$$

From the foregoing it is founded that the differential signal S1 with a primary high-pass filter characteristic, where a cut-off frequency fc is taken to be $\omega c/2\pi$, is obtained from the midpoint of the connection between the differential pair and the diode. In addition, the value of the emitter resistance "re" can be varied in accordance with the current $I_1$ supplied from the constant current sources 6 and 7. Therefore, the cut-off frequency fc can be freely adjusted.

According to the aforementioned constitution, the circuit can be constituted only by NPN transistors, whereby there can be realized a primary filter in which the number of manufacturing processes is reduced compared with prior art. Also, since all signals in the circuit are differential signals, a primary filter which is less susceptible to the influences of power-supply voltage variation and external noise can be realized.

In addition, since the common-mode feedback circuit 4 does not need to be provided as it is provided in the conventional filter, a primary filter can be realized, where the size of the circuit constitution and the number of devices can be reduced.

(1-2) State variable filter (secondary filter)

Figure 4:
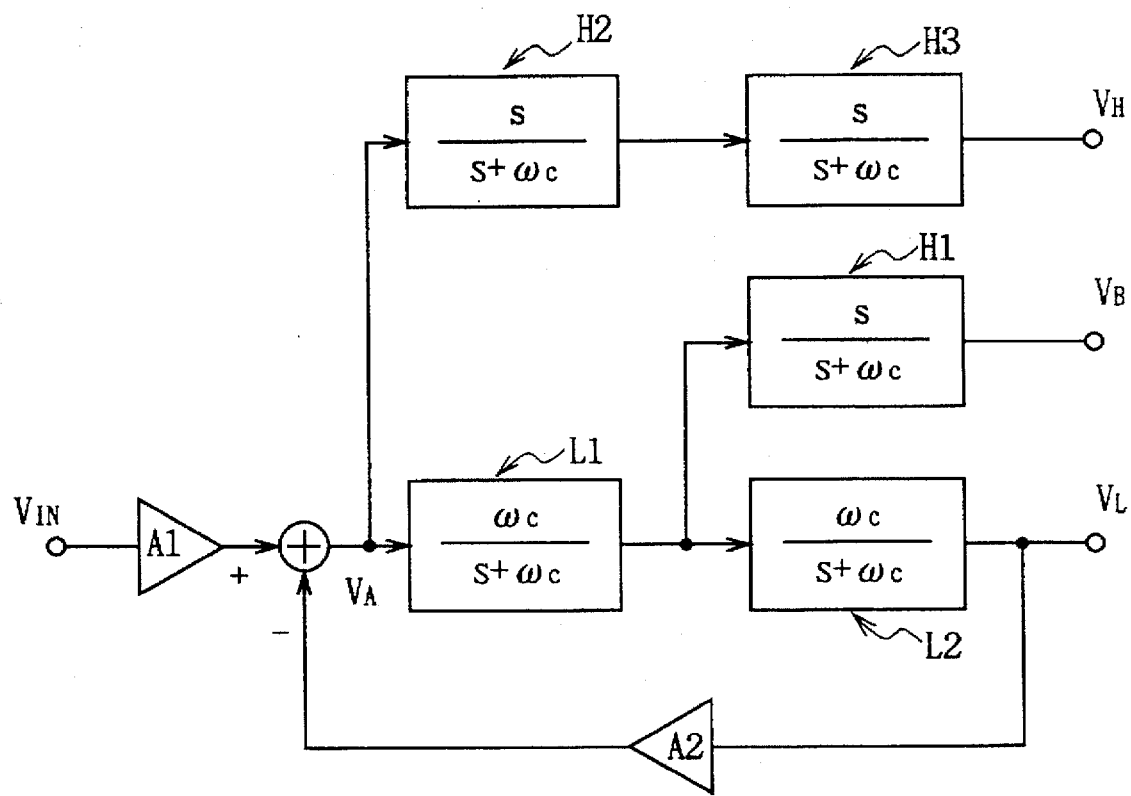
FIG. 4 is a block diagram showing a secondary filter constituted by the basic circuit of the filter circuits according to the present invention.

Subsequently, the circuit constitution of a secondary filter will be described. FIG. 4 shows the block constitution of a secondary filter 8. The secondary filter 8 is constituted by a combination of primary low-pass filter blocks L1, L2, and primary high-pass filter blocks H1, H2, and H3, which are obtained from the aforementioned primary filter 5.

In FIG. 4, the blocks of $\omega c/(s+\omega c)$ represent primary low-pass filters and the blocks of $S/(s+\omega c)$ represent primary high-pass filters. Furthermore, reference characters A1 and A2 represent a multiplied-by-A1 amplifier and a multiplied-by-A2 amplifier, respectively.

It will be described in the aforementioned constitution that the secondary filter 8 becomes a secondary filter with three kinds of outputs. First, it will be described that the characteristic of an output signal, output from the primary low-pass filters L1 and L2 of two stages, becomes a secondary low-pass filter characteristic. Now, if the output voltage of an adder is taken to be $V_A$ and the output voltage of the primary low-pass filter L2 is taken to be $V_L$, the following equations are established for two output voltages $V_A$ and $V_L$:

$$V_A = A1\, V_{IN} - A2\, V_L \quad (9)$$

$$V_L = \left[\frac{\omega c}{s+\omega c}\right]^2 V_A \quad (10)$$

Substituting the equation (9) into the equation (10) yields the relationship of the following equation:

$$V_L + \left[\frac{\omega c}{s+\omega c}\right]^2 (A1\, V_{IN} - A2\, V_L) \quad (11)$$

$$\left\{1 + A2\left[\frac{\omega c}{s+\omega c}\right]^2\right\} V_L = A1 \left[\frac{\omega c}{s+\omega c}\right]^2 V_{IN}$$

If the transfer function $H_L$ is calculated from the equation (11), it will be found that the transfer function $H_L$ has a secondary low-pass filter characteristic like the following equation:

$$H_L = \frac{V_L}{V_{IN}} = \frac{A2\left[\frac{\omega c}{s+\omega c}\right]^2}{1 + A2\left[\frac{\omega c}{s+\omega c}\right]^2} \quad (12)$$

$$= \frac{A1\, \omega c^2}{s^2 + 2\omega cs + (1+A2)\omega c^2}$$

Therefore, the resonance angular frequency $\omega 0$ and the quality factor Q are given by the following equations:

$$\omega 0 = \sqrt{1+A2}\,\, \omega c \quad (13)$$

$$Q = \frac{\omega 0}{2\omega c} = \frac{\sqrt{1+A2}}{2} \quad (14)$$

From this it is found that these values can be adjusted by adjusting the gain of the amplifier A2.

Similarly, if the output voltage, which is output through the primary low-pass filter L1 and the primary high-pass filter H1, is taken to be $V_B$ and the transfer function $H_B$ is calculated, the following equation is obtained:

$$H_B = \frac{A1\, \omega cs}{s^2 + 2\omega cs + (1+A2)\omega c^2} \quad (15)$$

From these it is found that the output voltage $V_B$ becomes a secondary band-pass filter characteristic. Therefore, the resonance angular frequency $\omega 0$ and the quality factor Q are the same as that of the equations (13) and (14), respectively.

Similarly, if the output voltage which is output through the primary high-pass filters H2 and H3, is taken to be $V_H$ and the transfer function $H_H$ is calculated, the following equation is obtained:

$$H_H = \frac{A1\, s^2}{s^2 + 2\omega cs + (1+A2)\omega c^2} \quad (16)$$

It is found that the output voltage $V_H$ becomes a secondary high-pass filter characteristic.

Figure 5:
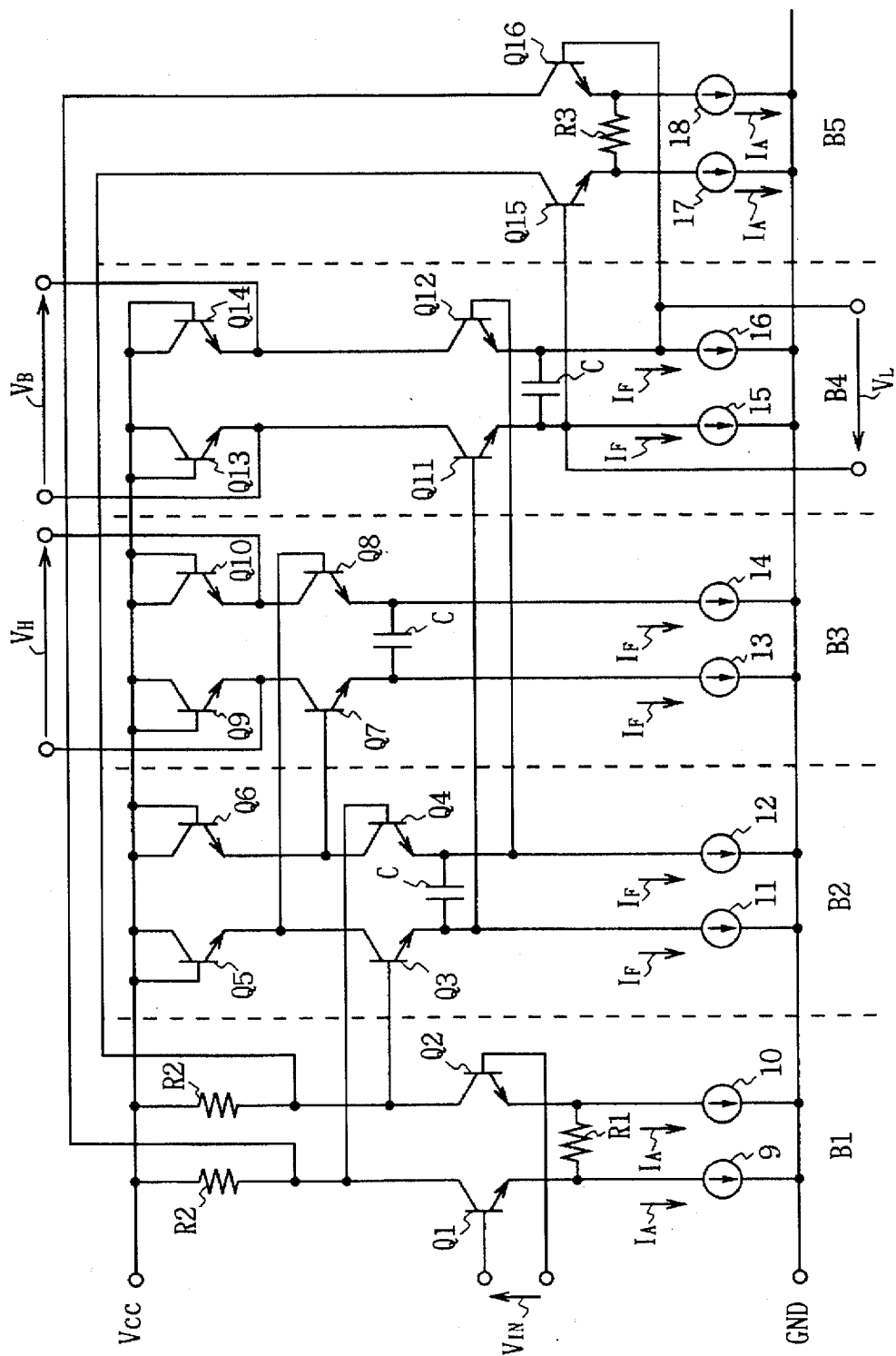
FIGS. 5 and 6 are circuit diagrams showing the concrete example of the block diagram shown in FIG. 4.
Figure 6:
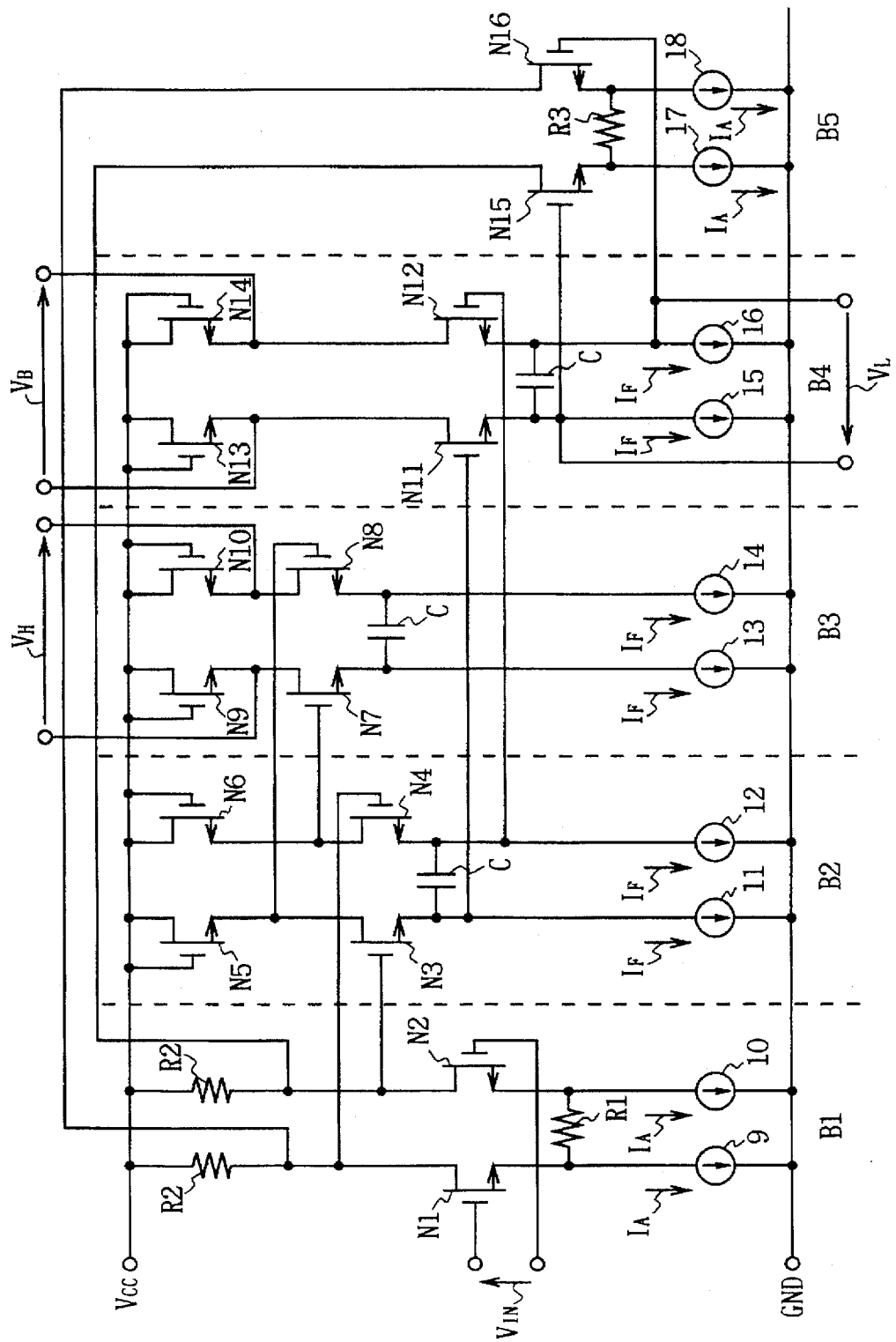

FIGS. 5 and 6 show the concrete circuit example of the secondary filter 8 with this characteristic. The circuit shown in FIG. 5 uses an NPN bipolar transistor and the circuit shown in FIG. 6 uses an N-channel type field effect transistor.

The circuit of the concrete example are respectively constituted by five blocks B1 to B5. The blocks B2 to B4 are primary filters, which are constituted similar to that of the primary filter 5 shown in FIG. 3.

In addition, the block B2 corresponds to the primary low-pass filter block L1 and primary high-pass filter block H2 shown in FIG. 4. The block B3 corresponds to the primary high-pass filter block H3 shown in FIG. 4. The block B4 corresponds to the primary low-pass filter block L2 and primary high-pass filter block H1 shown in FIG. 4. The block B1 corresponds to the amplifier A1 and the adder. The block B5 corresponds to the amplifier A2.

Here, the block B5 obtains a differential current having a magnitude corresponding to the output of the low-pass filter block L2 from the midpoint of the connection between the differential part of the block B1 and each of the load resistors R2.

Therefore, the block B5 causes a voltage of the sum of the voltage that the input voltage $V_{IN}$ is multiplied by A1 and the voltage that the output voltage $V_L$ is multiplied by A2 to generate in the resistors R2.

Therefore, in the case of this circuit constitution, the gain G1 of the amplifier A1 comes to $R2/(R1+V_T/I_A)$ and the gain G2 of the amplifier A2 comes to $R2/(R3+V_T/I_A)$.

In addition, among parameters giving ωc (=½ re C), the emitter resistance "re" comes to $V_T/I_F$. Therefore, by varying the value of a constant current $I_F$, only a resonance angular frequency ω0 can be controlled while the value of a quality factor Q is being fixed.

According to the constitution mentioned above, the secondary filter 8 can be constituted only by the primary filters 5 described in the previous part. Therefore, miniaturization of the circuit constitution and a reduction in the number of devices can be realized compared with a case where a filter is constituted by the integrator 1. Also, the secondary filter 8 is constituted by a differential circuit, so that it is less susceptible to the influences of power-supply voltage variation and external noise. Further, the circuit can be constituted by only NPN transistors, so that the secondary filter 8 can be simplified in a manufacturing process comparing to the prior art.

Figure 7:
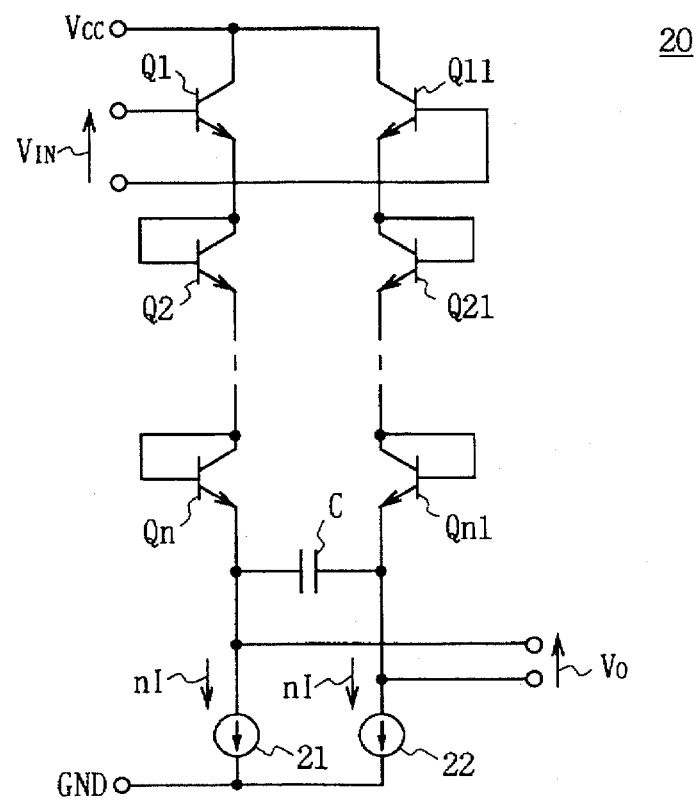
FIG. 7 is a circuit diagram showing the basic constitution of a filter circuit according to the present invention.

(2) Dynamic range expanded type primary filter of the embodiment (2-1) Basic constitution Next, FIG. 7 shows an example the constitution of a primary filter having a dynamic range expanded to "n" times the primary filter 5 of FIG. 3. The primary filter 20 is also identical in basic constitution with the primary filter 5 of FIG. 3 and is constituted by a differential pair, a diode, a current source, and a capacitor.

There is two points in difference. First different point is that diode-connected transistors having the number of (n−2) Q2, Q21, ..., Qn, and Qn1 are connected in series between constant current sources 21, 22 and the emitters of transistors Q1, Q11 constituting the differential pair. Second different point is that the constant current sources 21, 22 supply the current nI of "n" times the case of the constant current sources 6, 7 in FIG. 3 to the transistors Q1, Q11 constituting the differential pair, respectively.

Now, since the number of emitter resistance "re" connected between a capacitor C and each of bases of the transistors Q1, Q11 constituting the differential pair is "n", the transfer function H (=$V_O/V_{IN}$) of the primary filter 20 is calculated in reference to the equation (5), and it will become as the following equation:

$$H = \frac{V_O}{V_{IN}} = \frac{\frac{1}{sC}}{2n\,re + \frac{1}{sC}} \quad (17)$$

The value of each emitter resistance "re" is given by $V_T/nI$. Thereby, this value is substituted into the equation (17), the following equation is obtained:

$$H = \frac{\frac{1}{sC}}{2n \cdot \frac{V_T}{nI} \cdot \frac{1}{sC}} \quad (18)$$

$$= \frac{\frac{I}{2CV_T}}{S + \frac{I}{2CV_T}} = \frac{\omega c'}{S + \omega c'}$$

It is found that this equation shows a low-pass filter characteristic.

Incidentally, since the value of a parameter $V_T/I$ giving a value of ωc' in the equation (18) is the same as the emitter resistance "re" in the circuit of FIG. 3.

Thus, it is found that ωc of the primary filter 5 shown in FIG. 3 and ωc' of the primary filter 20 shown in FIG. 7 are the same value. Therefore, the primary filter 5 and the primary filter 20 become the same for the cut-off frequency fc.

That is, it is found that the characteristics of the primary filter 20 are the same as that of the primary filter 5, excepting that the number of emitter resistances "re", which are connected between each base of the transistors Q1 and Q11 constituting the differential pair and the capacitor C, is "n" times the case of the primary filter 5 and that the dynamic range becomes "n" times.

According to the constitution described above, the primary filter 20 where the dynamic range is "n" times that of the primary filter 5 of FIG. 3 can be obtained. Further, similar to the primary filter 5 described above, the primary filter 20 can be constituted only by the NPN transistors, so that the manufacturing process can be simplified increasingly. Further, the primary filter 20 is constituted by the differential circuit so as to have the feature that is less susceptible to the influences of power-supply voltage variation and external noise.

In addition, since the common-mode feedback circuit 4 does not need to be provided as it is provided in the conventional filter, the circuit constitution can also be miniaturized and the number of devices can also be reduced.

(2-2) Low power-supply voltage corresponding type primary filter

Figure 8:
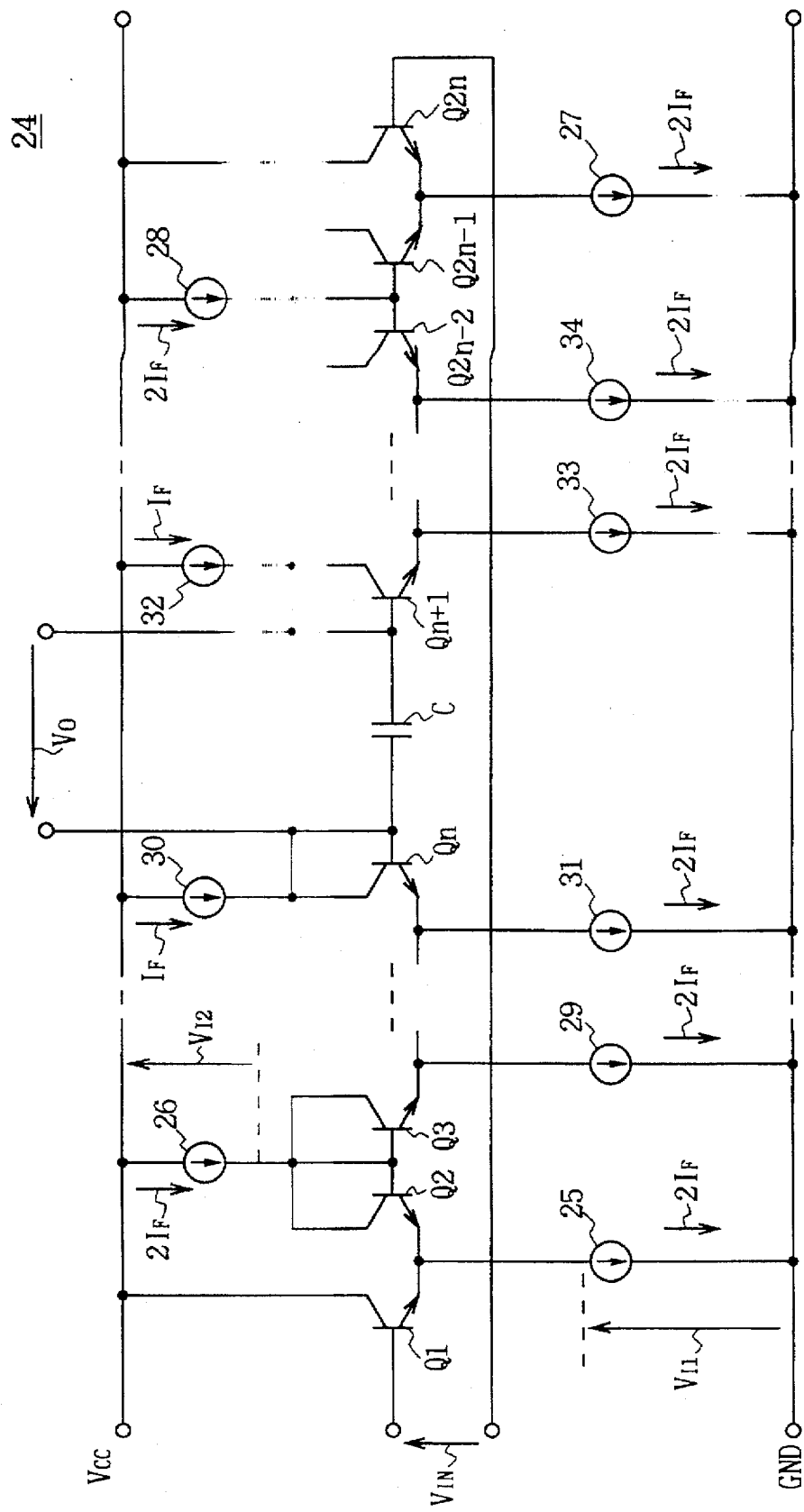
FIGS. 8 and 9 are circuit diagrams showing an embodiment of the filter circuit according to the present invention.

Next, FIG. 8 shows the constitution example of a primary filter, which can be operated at low power-supply voltage compared with the primary filter 20 shown in FIG. 7 while having a dynamic range which is "n" times that of the primary filter 5 shown in FIG. 3. The primary filter 24 shown in FIG. 8 has a first differential pair constituted by a transistor Q1 being as a first transistor and a diode-connected transistor Q2 being as a first diode, and a second differential pair constituted by a transistor Q2n being as a second transistor and a diode-connected transistor Q2n-1 being as a second diode. Further, the primary filter 24 has the constitution that the first and second differential pairs are symmetric with respect to a capacitor C for taking out the signal component at a predetermined band from the both ends, and the capacitor C and the diode-connected transistors Q2, Q2n-1 are connected in series.

The primary filter 24 further has a constant current source 25 connected to ground line GND at its one end being as a first current source, a constant current source for diode 26 connected to the power-supply voltage $V_{CC}$ at its one end being as a second current source, a constant current source 27 connected to ground line GND at its one end being as a third current source, a constant current source for diode 28 connected to the power-supply voltage $V_{CC}$ at its one end being as a fourth current source, and (2n−4)-number diode-connected transistors Q3, ..., Q2n-2 being as a third diode.

The diode-connected transistor Q2 is connected to the constant current source 25 and constant current source for diode 26 for supplying a constant current $2I_F$.

Thereby, the constant current $I_F$ is supplied through the route different from the transistor Q1, and the transistor Q2 is maintained in a conducting state at all times.

Also, the transistor Q2n-1 is connected to the constant current source 27 and a constant current source for diode 28 for supplying the constant current $2I_F$.

Thereby, the constant current $I_F$ is supplied through the route different from the transistor Q2n, and the transistor Q2n-1 is maintained in a conducting state at all times.

The diode-connected transistors Q3, ..., Q2n-2 having the number of 2n−4 are connected in series between the diode-connected transistors Q2 and Q2n-1, and are connected such that an anode is next to an anode or a cathode is next to a cathode. Further, the diode-connected transistors Q3, ..., Q2n-2 are connected to constant current sources 26, 28, constant current sources for diode 29 to 34 for supplying the constant current $2I_F$ or $I_F$ which are connected to the power-supply voltage $V_{CC}$ or the ground line GND at its one end.

Thereby, the diode-connected transistors Q3, ..., Q2n-2 are respectively supplied the constant current $I_F$ through the route different from the first and second differential pairs, and are maintained in a conducting state constantly. At the same time, the neighboring transistors, e.g., Q2 and Q3 are differential-operated.

Therefore, it is founded that the primary filter 24 equals to the state where the emitter resistances "re" having the number of "n" are respectively connected in series between the electrodes of the bases of transistors Q1 and Q2n constituting a differential pair and the capacitor C. That is, the primary filter 24 equals to the primary filter 20 shown in FIG. 7, and it is founded that the dynamic range is "n" times that of the primary filter 5 shown in FIG. 3.

Therefore, the transfer function H of the primary filter 24 is obtained by the equation (17), and it is found that the transfer function H indicates a primary low-pass filter. However, in the case of the primary filter 24, the magnitudes of currents flowing to the transistors Q1 through Q2n are all $I_F$ and therefore the value of the emitter resistance "re" comes to $V_T/I_F$. Also, from the equation (17) the cut-off frequency fc of the primary filter 24 becomes as the following equation:

$$fc = \frac{1}{2\pi \times 2n\, re\, C} = \frac{1}{4\pi n\, re\, C} \tag{19}$$

Here, the minimum power-supply voltage $V_{CC}$ with which the primary filter 24 can be operated will be calculated. If the voltage between the base and emitter of each of the transistors Q1 to Q2n is taken to be $V_{BE}$ and the minimum operating voltages with which the constant current sources operate are taken to be $V_{f1}$ and $V_{f2}$, the condition of the power-supply voltage $V_{CC}$ needed for the primary filter 24 to operate is that it meets the following equation:

$$V_{CC} \geq V_{BE} + V_{f1} + V_{f2} \tag{20}$$

On the other hand, the condition of the power-supply voltage $V_{CC}$ needed for the primary filter 20 to operate is that it meets the following equation:

$$V_{CC} \geq n\, V_{BE} + V_{f1} + V_{f2} \tag{21}$$

Therefore, it is found that the primary filter 24 operates with a lower voltage reduced by $(n-1) V_{BE}$ comparing to the primary filter 20.

According to the constitution described above, the capacitor C taking out the signal component at the predetermined band from both ends is connected in series to the diode-connected transistor Q2 of the first differential pair which is in a conducting state constantly by the constant current source for diode 26, and also connected in series to the diode-connected transistor Q2n-1 of the second differential pair which is in a conducting state constantly by the constant current source for diode 28. At the same time, the diode-connected transistors having the number of (2n-4) Q3, ..., Q2n-1, which are in a conducting state constantly by the constant current sources for diode 26, 28, 29 to 34 are connected in series to the transistors Q2 and Q2n-1. Therefore, there can be realized a primary filter where the minimum operating voltage is lower and the dynamic range is more expanded than that of the prior art.

In addition, similar to the primary filter 20 described above, the primary filter 24 does not need to provide a conventional common-mode feedback circuit 4, so that the circuit constitution can be increasingly miniaturized and the number of devices can be reduced more.

(2-3) Low power consumption type primary filter

Figure 9:
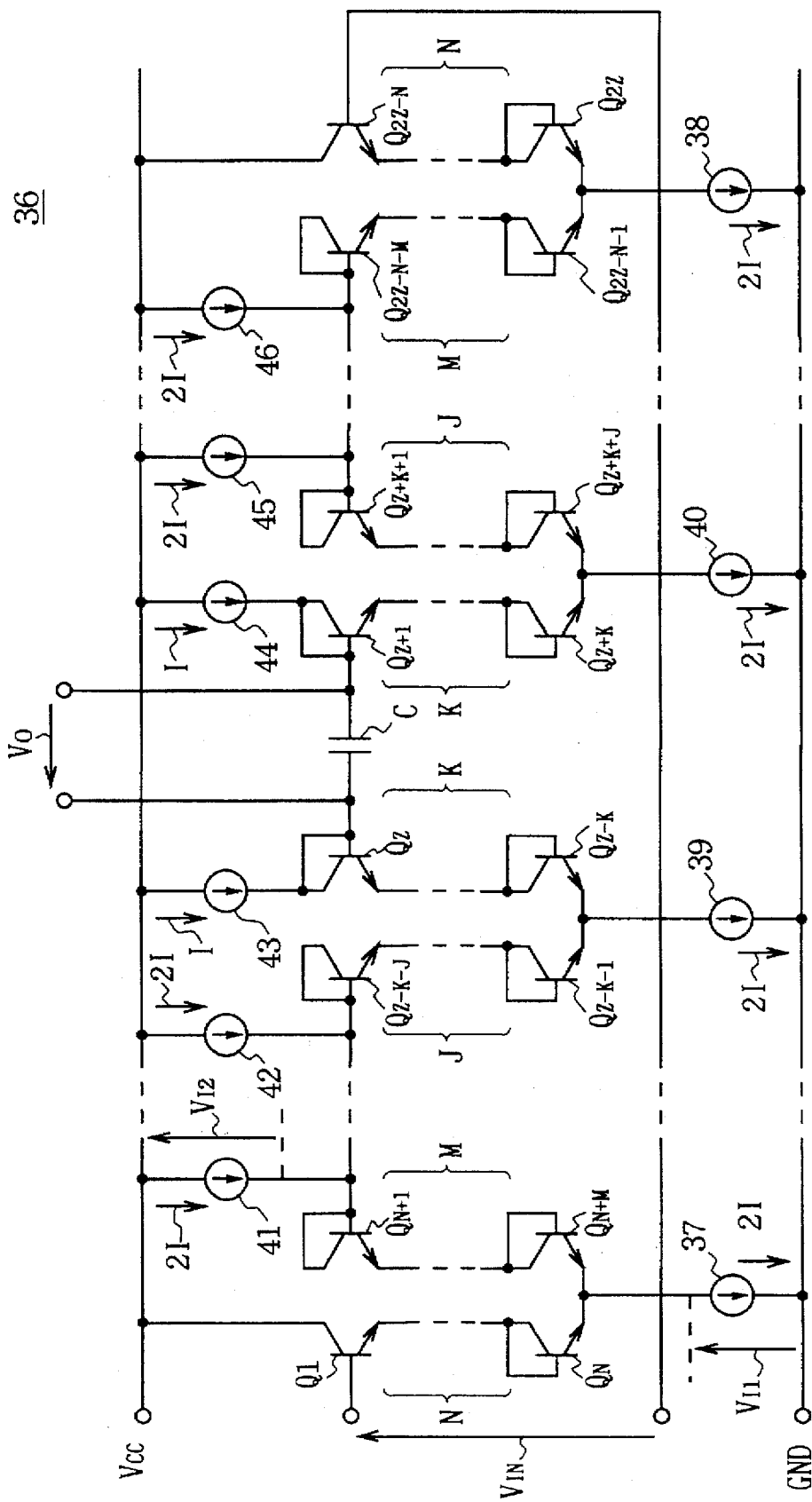

FIG. 9 shows the constitution of a primary filter 36 which can reduce power consumption in comparison with the primary filter 24 shown in FIG. 8. The point in difference between the primary filter 36 and the primary filter 24 is that a plurality of diode-connected transistors Q2, ..., $Q_N$, $Q_{N+2}$, ..., $Q_{N+M}$ being as a fourth diode are connected in series between the first differential pair and the constant current source 37 being as a first current source, and that a plurality of diode-connected transistors $Q_{2Z-N+1}$, ..., $Q_{2Z}$, $Q_{2Z-N-M+1}$, ..., $Q_{2Z-N-1}$ being as a fourth diode are connected in series between the second differential pair and the constant current source 38 being as a third current source.

The primary filter 36 has the configuration that the fourth and third diodes are symmetric with respect to the capacitor C taking out the signal component at the predetermined band from both ends. That is, the fourth diodes having the number of N-1 are respectively connected to the emitter of the transistor Q1 being as a first transistor of a first differential pair, and connected to the emitter of the transistor $Q_{2Z-N}$ being as a second transistor of a second differential pair. Also, the fourth diodes having the number of M-1 are respectively connected between the emitter of the diode-connected transistor $Q_{N+1}$ being as a first diode and the constant current source 37, and connected between the emitter of the diode-connected transistor $Q_{2Z-N-M}$ being as a second diode and the constant current source 38.

In the same way, the third diodes having the number of J-1 are respectively connected between the emitter of the diode-connected transistor $Q_{Z-K-J}$ being as a third diode and the constant current source for diode 39, and connected between the emitter of the diode connected transistor $Q_{Z+K+1}$ being as a third diode and the constant current source for diode 40. Also, the third diodes having the number of K-1 are respectively connected between the emitter of diode-connected transistor $Q_Z$ being a third diode and the constant current source for diode 39, and connected between the emitter of diode-connected transistor $Q_{Z+1}$ being a third diode and the constant current source for diode 40.

In addition, the number of respective diodes can be set freely.

Here, a case is considered in which the third and fourth diodes having the same number of the third diode used in the primary filter 24 are connected between the transistors Q1 and $Q_{2Z-N}$ of a differential pair. In this case, the constant current sources for a plurality of diodes 42 to 45 of the differential pair at the power-supply voltage $V_{CC}$ side, and the constant current sources for a plurality of diodes 39 and 40 at the ground line GND side can be reduced in accordance with the number of a pair of diode, N-1, M-1, ....

In this way, the reduction in the number of constant current sources for diode 39, 40, 42 to 45 means that a reduction in power consumption.

Note that, when the number of transistors is taken to be 2n, the value of the transfer function H of the primary filter 36 equals to the value of the cut-off frequency fc of the primary filter 36.

According to the constitution described above, there can be realized a primary filter which can reduce power consumption in comparison with the circuit of FIG. 8. Note that, even in this embodiment, as described in the aforementioned embodiment, the same advantages are obtainable for a reduction in the size of the circuit.

(3) Example of an application device

Figure 10:
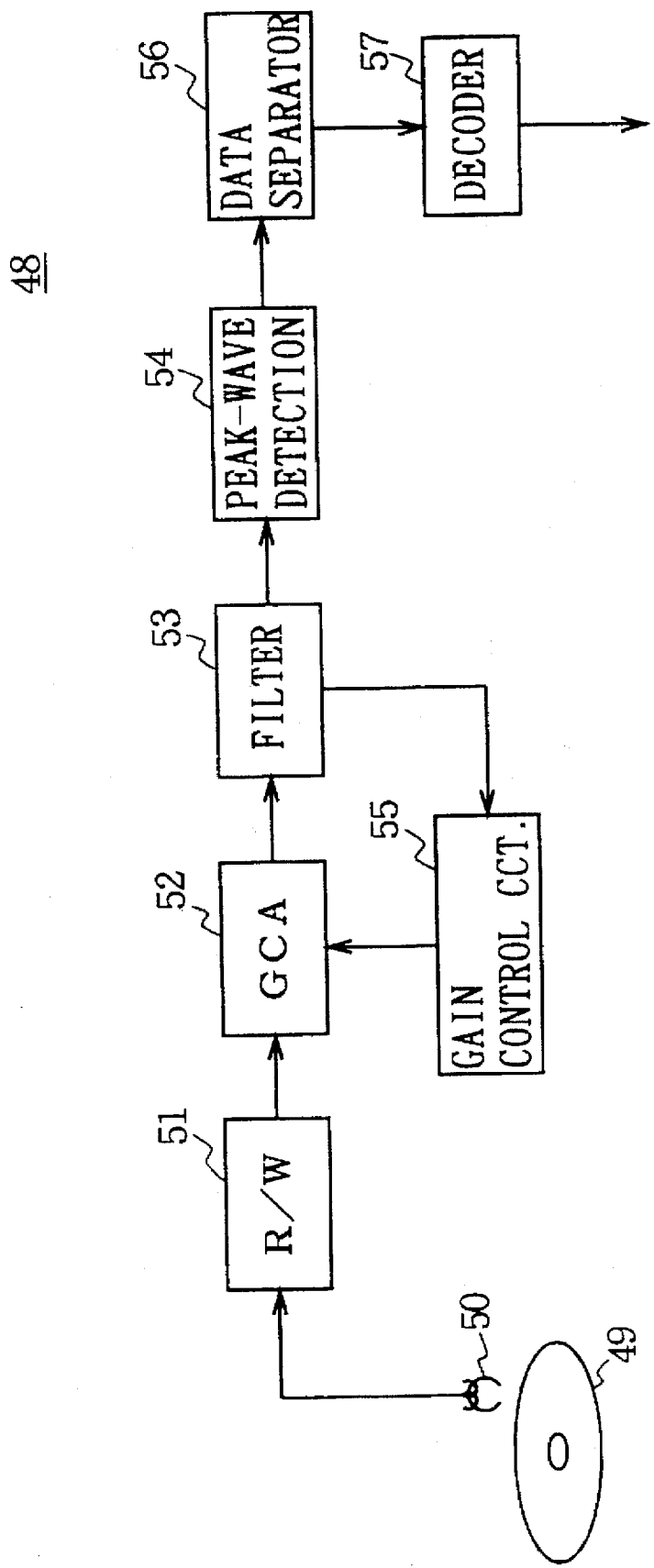
FIG. 10 is a circuit diagram showing an embodiment of an electronic apparatus according to the present invention.

Finally, an example of an electronic apparatus using the primary filters 24, 36 described above or secondary filter composed of these primary filters will be explained. FIG. 10 shows the reproducing system of a hard disk unit 48 as a whole. Because the frequency of a signal read out from the inner circumferential side of a magnetic disc unit 49 differs from that of a signal read out from the outer circumferential side, the hard disk unit 48 switches a cut-off frequency fc so that it can deal with the different frequency. On the filter part for switching the cut-off frequency fc in this way, the filters described above are used.

In addition, even if the secondary filter is composed of the primary filters 24, 36, the circuit constitution can be simplified increasingly since an integrator is unnecessary.

The hard disk unit 48 amplifies a signal reproduced through a magnetic head 50 from the magnetic disc unit 49 at a recording/reproducing amplifier 51 and outputs it to a gain control amplifier 52. The gain control amplifier 52 amplifies the output signal so that the signal level thereof becomes constant, and outputs this to a filter 53.

The filter 53, when extracting a signal component in a predetermined band, outputs the signal component to a peak-wave detecting circuit 54 and a gain control circuit 55. The gain control circuit 55 determines a degree of amplification of the gain control amplifier 52, based on the signal level of the extracted signal component, and outputs it to the gain control amplifier 52.

The peak-wave detecting circuit 54, on the other hand, detects the peak of the extracted signal component and outputs it to a data separator 56. The data separator 56 separates data based on the peak-wave detected signal, and gives it to a decoder circuit 57. The decoder circuit 57 converts the input signal to non-return-to-zero (NRZ) coding data and outputs it. Through this sequence of operations the hard disk unit 48 reproduces data.

According to the constitution described above, the primary filters 24 and 36 or secondary filter are used in the filter 53, so that a hard disk unit which can further reduce the size of the mounting area is obtainable. In addition, a low power-supply voltage drive type of hard disk unit or a low power consumption type of hard disk unit can be realized.

(4) Other embodiments

The aforementioned embodiments have been dealt with the case where the circuit example described in the first embodiment is applied as the secondary filter. However, the present invention is not limited to this, but can be applied to other circuit constitutions.

In any case, the secondary filter can be constituted by the primary filter, so that the circuit can be reduced in its size.

Also, the aforementioned embodiments have been dealt with a primary filter and a secondary filter. However, the present invention is not limited to this, but filters more than third can be applied.

Further, the aforementioned embodiments have been dealt with the case where the differential pair and the diode are symmetric with respect to the capacitor C being centered. However, the present invention is not only limited to this, but the capacitor C can be connected in series at an arbitrary position between the emitter of first transistor of a first differential pair and the emitter of second transistor of a second differential pair. However, also in this case, a first, second, third, and fourth diodes are constantly in a conducting state by the constant current source for diodes regardless of the connecting position of the capacitor.

Furthermore, the aforementioned embodiments have been dealt with a hard disk unit as an example of a unit applying the filter of the embodiment. However, the present invention is not limited to this, but it can be used in all electronic apparatus which require a filter.

According to the present invention, as described above, a capacitor C taking out the signal component in a predetermined band from both ends is connected in series to a first diode, which is constantly in a conducting state by a second current source for diode, of a first differential pair to which one of the differential input signal is given, and a second diode, which is constantly in a conducting state by a fourth current source for diode, of a second differential pair to which the other of the differential input signal is given. Thereby, a filter circuit and an electronic apparatus using the filter circuit can be realized, in which the circuit can be reduced in its size, and the minimum operating voltage is increasingly reduced and dynamic range is expanded than that of prior arts.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A filter circuit comprising:

a first differential pair composed of a first transistor to which one input signal of a differential input signal is supplied at the base of said first transistor, and a first diode, connected in series to the emitter of said first transistor;

a first current source, provided between the emitter of said first transistor and a first power-supply source, for driving at least said first transistor;

a second current source, provided between said first diode and a second power-supply source, for constantly conducting said first diode;

a second differential pair composed of a second transistor to which a second input signal of said differential input signal is supplied at the base of said second transistor, and a second diode, connected in series to the emitter of said second transistor;

a third current source, provided between the emitter of said second transistor and said first power-supply source, for driving at least said second transistor;

a fourth current source, provided between said second diode and said second power-supply source, for constantly conducting said second diode; and a capacitor, connected in series to said first and second diodes between the emitters of said first and second transistors, for taking out a signal component in a predetermined band from both ends.

2. The filter circuit according to claim 1, wherein a third diode is connected in series between said first diode and said second diode.

3. The filter circuit according to claim 2, wherein said third diode is composed of a plurality of diodes, and is positioned symmetrically with respect to said capacitor being centered.

4. The filter circuit according to claim 1, wherein a fourth diode is connected in series between the emitter of said first transistor and said first diode, and between the emitter of said second transistor and said second diode.

5. An electronic apparatus having a processing circuit for processing a signal based on a signal component in a predetermined band extracted in a filter circuit which gives a differential signal input, wherein said filter circuit input, comprising:

a first differential pair composed of a first transistor to which one input signal of a differential input signal is supplied at the base of said first transistor, and a first diode, connected in series to the emitter of said first transistor;

a first current source, provided between the emitter of said first transistor and a first power-supply source, for driving at least said first transistor;

a second current source, provided between said first diode and a second power-supply source, for constantly conducting said first diode;

a second differential pair composed of a second transistor to which a second input signal of said differential input signal is supplied at the base of said second transistor, and a second diode, connected in series to the emitter of said second transistor;

a third current source, provided between the emitter of said second transistor and said first power-supply source, for driving at least said second transistor;

a fourth current source, provided between said second diode and said second power-supply source, for constantly conducting said second diode; and a capacitor, connected in series to said first and second diodes between the emitters of said first and second transistors, for taking out the signal component in a predetermined band from both ends.

6. The electronic apparatus according to claim 5, having:

a reproducing head for reproducing information from a recording medium; and a decoder for converting said extracted signal component in a predetermined band and for reproducing data.

* * * * *